United States Patent
Park et al.

(10) Patent No.: US 7,294,516 B2
(45) Date of Patent: Nov. 13, 2007

(54) TEST PATTERNS AND METHODS OF CONTROLLING CMP PROCESS USING THE SAME

(75) Inventors: Jeong-Heon Park, Suwon-shi (KR); Bo-Un Yoon, Seongnam-shi (KR); Jae-Dong Lee, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 406 days.

(21) Appl. No.: 11/055,505

(22) Filed: Feb. 10, 2005

(65) Prior Publication Data

US 2005/0145602 A1    Jul. 7, 2005

Related U.S. Application Data

(62) Division of application No. 10/396,595, filed on Mar. 25, 2003, now Pat. No. 6,875,997.

(30) Foreign Application Priority Data

Apr. 11, 2002  (KR)  ............................. 2002-19670

(51) Int. Cl.
*H01L 31/26* (2006.01)
*H01L 23/58* (2006.01)

(52) U.S. Cl. .................. 438/14; 438/692; 438/693; 438/E21.244; 438/E51.028; 257/48

(58) Field of Classification Search ............ 438/11–15, 438/690–693; 257/48, 620, 797
See application file for complete search history.

(56) References Cited

U.S. PATENT DOCUMENTS 6,117,775 A * 9/2000 Kondo et al. ............... 438/690
6,309,900 B1 * 10/2001 Maury et al. ................ 438/16

* cited by examiner

*Primary Examiner*—Dung A. Le
(74) *Attorney, Agent, or Firm*—F. Chau & Associates, LLC

(57) ABSTRACT

A test pattern and a method of controlling a CMP using the same are provided. The test pattern is disposed on a monitoring region of a semiconductor substrate having a main region and a monitoring region. The test pattern includes a planar region and a pattern region. The method comprises setting a correlation between a step difference of a test pattern and an etched thickness of a main pattern, then applying the CMP to a semiconductor substrate having the test pattern and the main pattern for a predetermined time. The step difference of the test pattern is measured and the etched thickness of the main pattern, which corresponds to the step difference of the test pattern, is determined from the correlation. A polishing time is corrected by comparing the determined etched thickness of the main pattern with a reference value, and the corrected polishing time is applied to a subsequent lot or subsequent substrate.

11 Claims, 9 Drawing Sheets

TEST PATTERNS AND METHODS OF CONTROLLING CMP PROCESS USING THE SAME

CROSS-REFERENCE TO RELATED APPLICATION

This application is a Divisional of U.S. patent application Ser. No. 10/396,595 filed on Mar. 25, 2003, now U.S. Pat. No. 6,875,997, which is incorporated herein by reference and which claims foreign priority under 35 U.S.C. § 119 to Korean Application No. 2002-19670, filed on Apr. 11, 2002.

FIELD OF THE INVENTION

The present invention relates generally to semiconductor devices and, more particularly, to test patterns and methods of controlling chemical mechanical polishing (CMP) using the same.

BACKGROUND OF THE INVENTION

As integration of semiconductor devices increases and multi-layer interconnection processes are more readily applied, global planarization of interlayer dielectric layers is becoming increasingly important. While variable techniques have been used for the global planarization, CMP processes have been widely used in recent years due to numerous well-known advantages.

On the other hand, using the CMP process generates process dispersion, which usually result from changes in characteristics of dissipative parts such as pads, slurry, and heads. When use of the CMP process generates poor dispersion, adverse effects on performance and yield of products may result. For this reason, in the case of conventional CMP processes, a sample lot is polished by the CMP beforehand. The process time of polishing the sample lot is calculated and is then applied when a main lot is polished by the CMP. However, because this method is greatly influenced by prior factors, accuracy of a pre-set process time can vary depending on operator experience or ability. To overcome this problem, a method of controlling a process time was proposed, in which, although characteristics of a CMP apparatus change with time, a CMP time based on the latest characteristics of the CMP apparatus is applied. The method is disclosed in Korean Patent Publication No. 2001-55689 entitled "A METHOD OF CONTROLLING THE CMP TIME."

FIGS. 1 to 4 are cross-sectional views illustrating a conventional CMP process.

The conventional CMP is divided into a process of planarizing an insulation layer and a process of forming a pattern. The process of forming a pattern comprises forming a polishing target layer on the patterned insulation layer and polishing the polishing target layer until the insulation layer is exposed, in order to form a contact plug, a capacitor electrode, or a metal interconnection. When a pattern is formed using the CMP, it is important that the polishing target layer does not remain on the insulation layer. Generally, an upper portion of the insulation layer is over-etched to prevent the polishing target layer from remaining on the insulation layer. An over-etched thickness is measured from a thickness of the insulation layer before and after the CMP. The over-etched thickness is compared with a reference value and this enables correction of a CMP time. Also, the corrected CMP time may be applied to a subsequent substrate. As a result, a process deviation of the CMP can be reduced.

Referring to FIG. 1, main patterns 8 are disposed on a main region b of a semiconductor substrate 1 where circuits or devices will be formed. Test patterns 2 for monitoring a process state of the main region b are disposed at a predetermined region of the semiconductor substrate 1. Generally, the test patterns 2 are disposed at a monitoring region a, which is positioned on a scribe line between the main regions b. Each test pattern 2 is formed to various shapes depending on monitoring processes.

Referring to FIGS. 2 and 3, a CMP target layer 10 is formed on an entire surface of the semiconductor substrate 1 where the test pattern 2 and the main pattern 8 are formed. Continuously, the CMP target layer 10 is polished to expose the main pattern 8 and the test pattern 2. Thus, an interconnection 12 is formed to fill a space between the main patterns 8. The main region b generally includes a region 8a of a high pattern density as well as a region 8b of a low pattern density. In addition, because the conventional test pattern 2 is formed for the purpose of measuring a thickness, the test pattern 2 is planarized unlike the main pattern 8. According to the CMP process, the polishing target layer 10 is polished by providing slurry having a high etch selectivity to the polishing target layer 10. Therefore, when the CMP process is performed, a polishing rate is dependant on a pattern density.

As illustrated in FIG. 4, after the CMP, an etched thickness of the test pattern 2 differs from that of the main pattern 8. In general, a thickness of the test pattern 2 is measured before and after the CMP in order to monitor the process. Thus, even though an etched thickness is measured to be appropriate, it is difficult to rely on a process state of the main region. In other words, it is possible that the main pattern 8 is unnecessarily over-etched according to a pattern density of each region of the main region b (see 16 of FIG. 4). Otherwise, the polishing target layer 10 may remain on the main pattern 8 (see 14 of FIG. 4).

Similar to the metal interconnection process, in the case where the polishing target layer 10 is composed of metals, a thickness of the test pattern 2 cannot be measured just before the CMP, because the test pattern 2 is covered with the polishing target layer 10. Thus, a thickness of the test pattern 2 should be measured before forming the polishing target layer 10. However, a cleaning process, which is performed before forming the polishing target layer 10, causes a change in the thickness of the test pattern 2. Consequently, an over-etched thickness of the test pattern 2 may be measured with low reliability.

SUMMARY OF THE INVENTION

A test pattern for monitoring CMP processes is provided. The test pattern makes it possible to measure an etched thickness of a main pattern during the CMP. Furthermore, a method of controlling the CMP, which can reduce process dispersion, is provided.

In accordance with an aspect of the present invention, there is provided a test pattern for monitoring CMP processes. The test pattern is disposed on a monitoring region of a semiconductor substrate having a main region and the monitoring region. The test pattern includes a planar region and a pattern region. The pattern region has the same structure as the main region.

In accordance with another aspect of the present invention, there is provided a method of controlling a CMP process. The method includes setting a correlation between a step difference of a test pattern and an etched thickness of a main pattern, to apply the CMP to a semiconductor substrate having the test pattern and the main pattern. The CMP is applied continuously to the semiconductor substrate for a predetermined time, and then the step difference of the test pattern is measured. After determining an etched thickness of the main pattern, which corresponds to the step difference of the test pattern, the determined etched thickness of the main pattern is compared with a reference value to correct a polishing time. Finally, the corrected polishing time is applied to a subsequent lot.

The method further comprises setting a reference value and preparing a plurality of semiconductor substrates. Each semiconductor substrate includes a main pattern and a test pattern. One substrate selected from the semiconductor substrates is polished by the CMP for a predetermined time. Next, a step difference of the test pattern is measured. The measured step difference is compared with the reference value, thereby correcting the polishing time. The corrected polishing time is applied to the CMP processes of other semiconductor substrates.

In the present invention, when the measured step difference is more than the reference value, the polishing time may be reduced. On the other hand, in the case where the measured step difference is less than the reference value, the polishing time may be extended. At this time, the polishing time may be set based on not only a difference between the measured step difference and the reference value, but also an increase rate of the step difference of the test pattern, which is obtained from experiments.

DETAILED DESCRIPTION OF PREFERRED EMBODIMENTS

Figure 1:
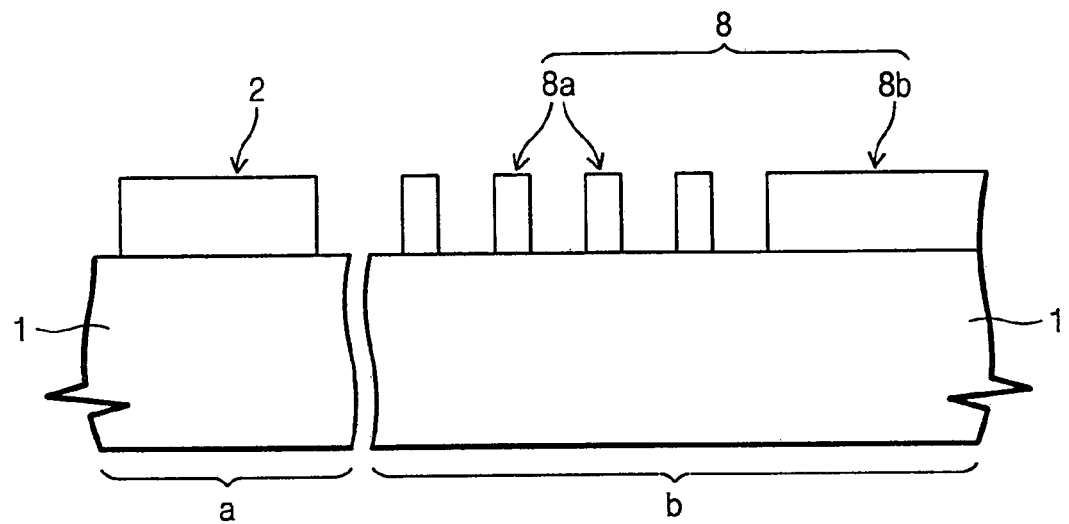
FIGS. 1 through 4 are cross-sectional views illustrating a conventional CMP process.
Figure 2:
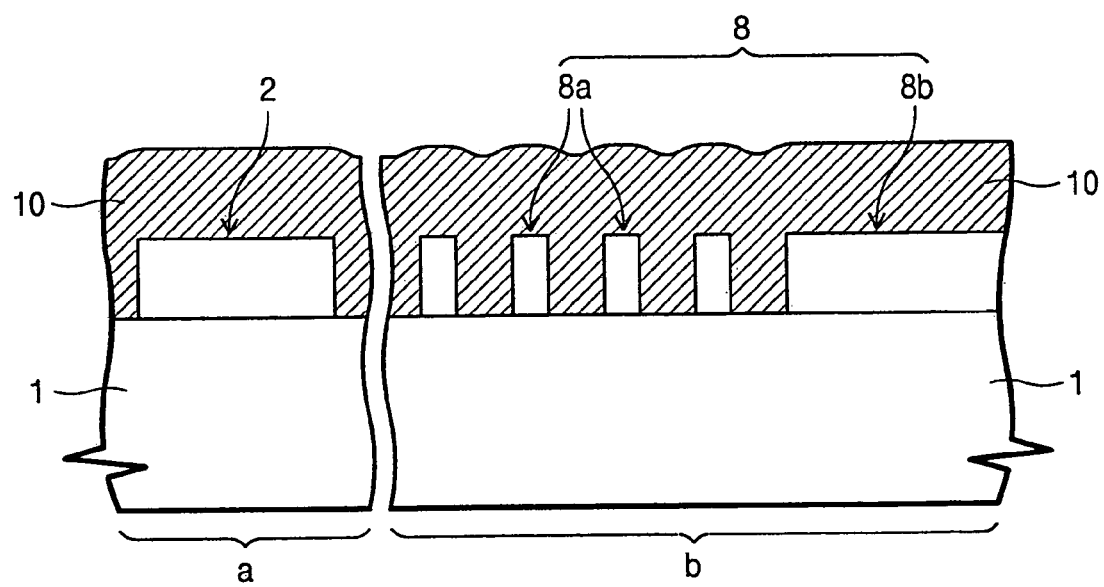
Figure 3:
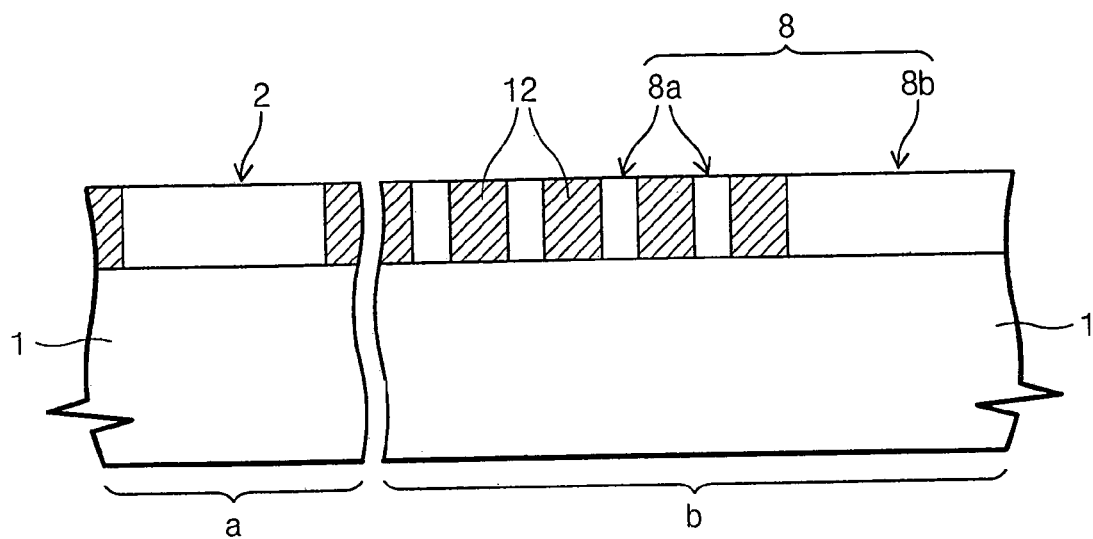
Figure 4:
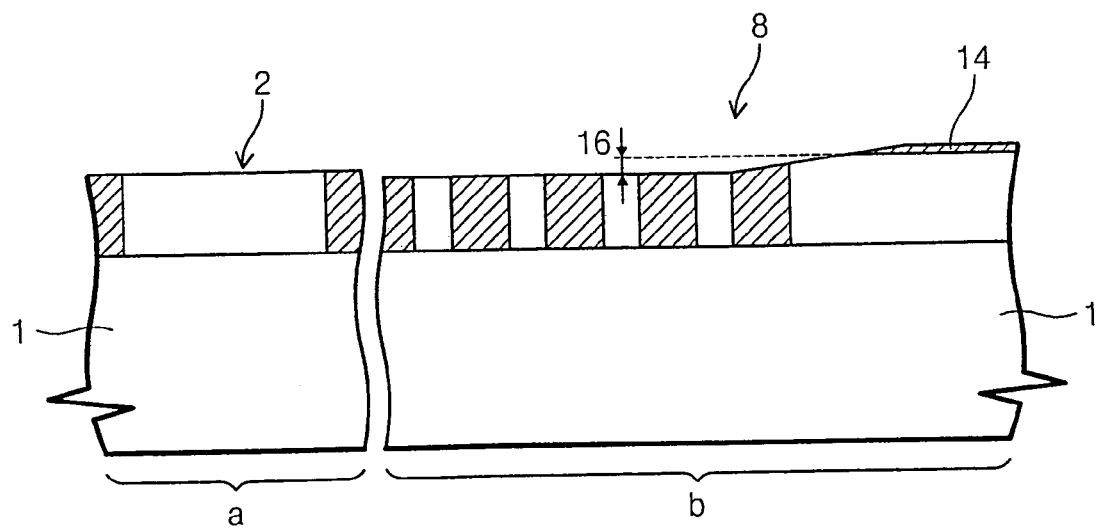

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 5:
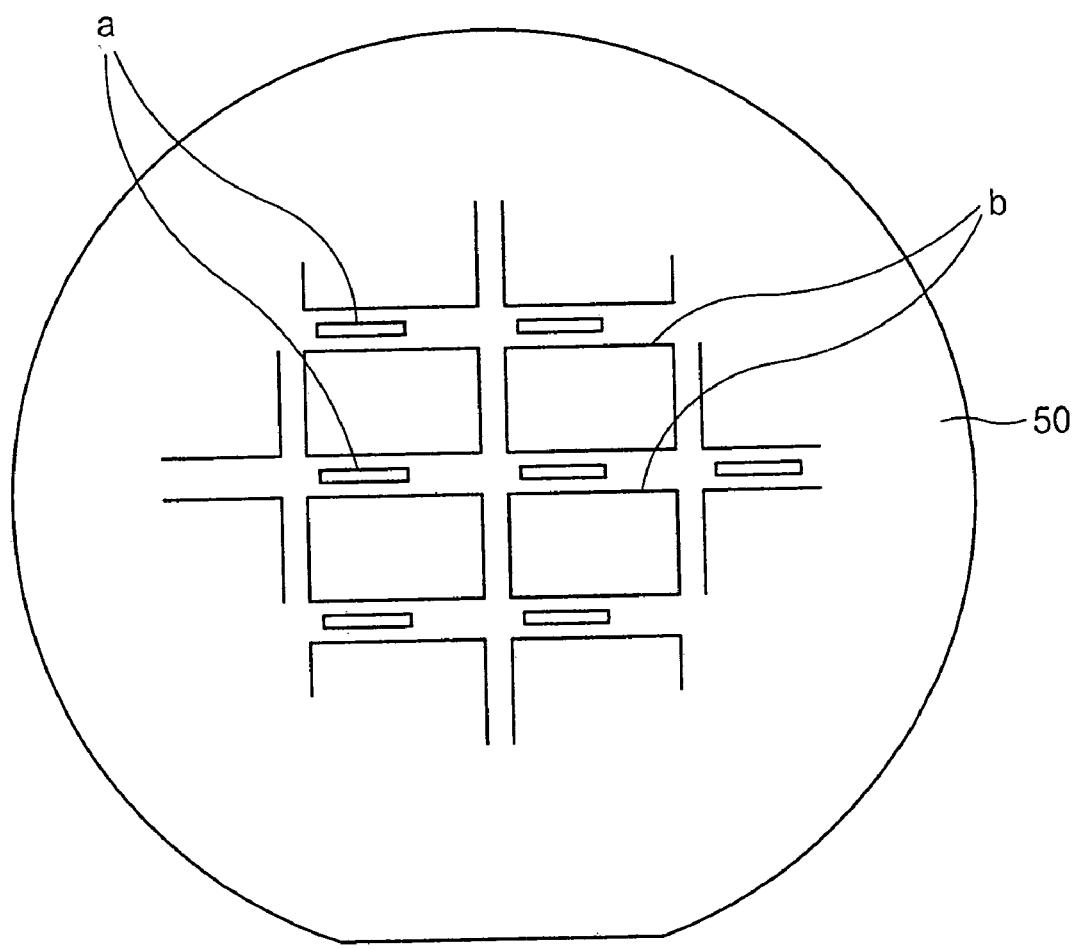
FIG. 5 is a schematic top plan view of a typical semiconductor substrate.

FIG. 5 is a schematic top plan view of a typical semiconductor substrate. Referring to FIG. 5, a semiconductor substrate 50 includes main regions b arranged in a matrix, in each of which semiconductor devices will be formed. After processes of fabricating devices are complete, the main regions are disposed at regular intervals to be separated from each other. In fabrication processes of semiconductor devices, test patterns are required for monitoring each process. The test patterns are formed to various shapes according to each process and are disposed at regions between the main regions b. That is, the regions between the main regions b correspond to monitoring regions a where the test patterns are disposed.

Figure 6:
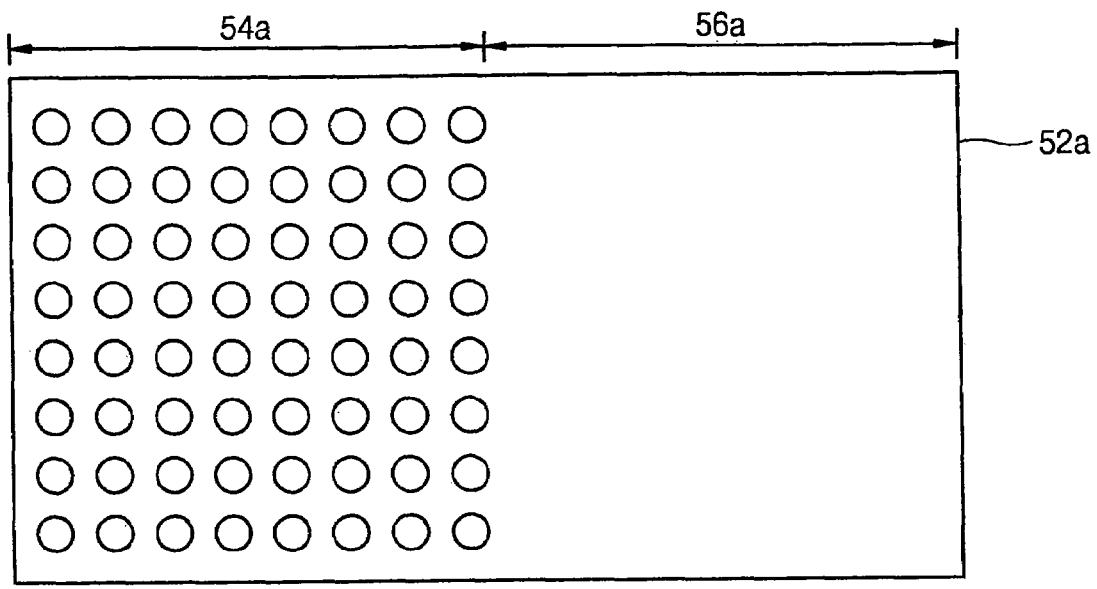
FIGS. 6 and 7 are top plan views of a test pattern according to a preferred embodiment of the present invention.
Figure 7:
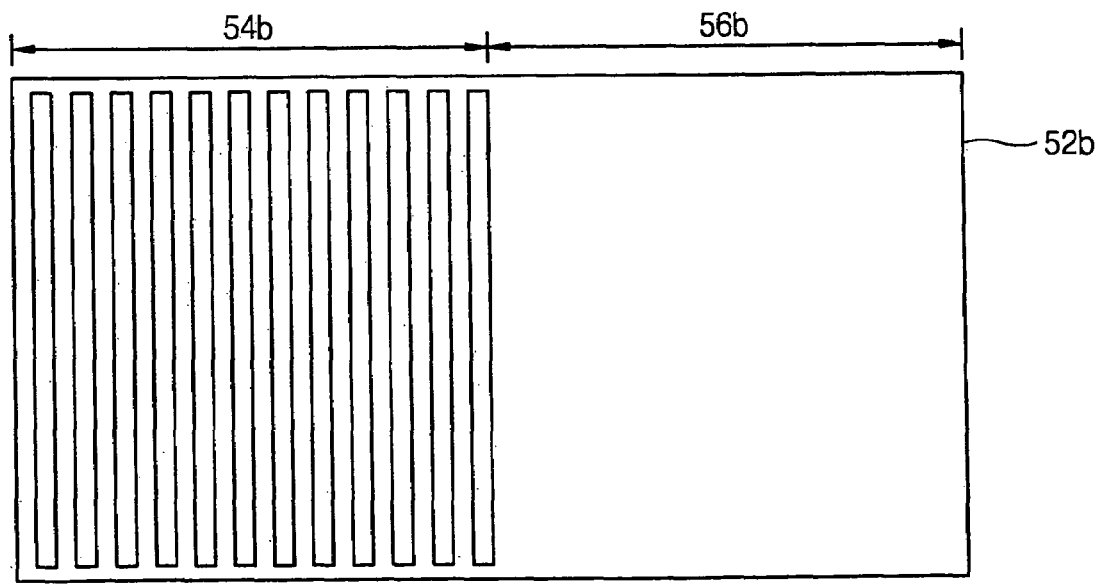

FIGS. 6 and 7 are top plan views of test patterns according to preferred embodiments of the present invention.

As illustrated in FIGS. 6 and 7, the test pattern of the present invention is divided into a pair of regions, which are different from each other in pattern density. For example, the test pattern 52a includes a planar region 56a where patterns are not formed as well as a pattern region 54a where patterns are formed. The pattern region 54a may have the same pattern density as the main region (b of FIG. 5). Preferably, patterns having the same structure, as the main pattern disposed at the main region may be disposed at the pattern region 54a. Also, the patterned portion and the planar portion may have a width of about 10 to about 100 μm and a length of about 10 to about 100 μm, respectively.

As exemplarily illustrated in FIG. 6, to form contact plugs in the main region (b of FIG. 5), contact holes having the same pattern density as contact holes formed in the main region b may be disposed at the pattern region 54a. That is, the pattern region 54a can be formed together while the contact holes are formed. For another example, in a damascene metalization process, grooves having the same pattern density as grooves for metal interconnections, which will be formed in the main region, can be disposed at the pattern region 54b (see FIG. 7).

Figure 8:
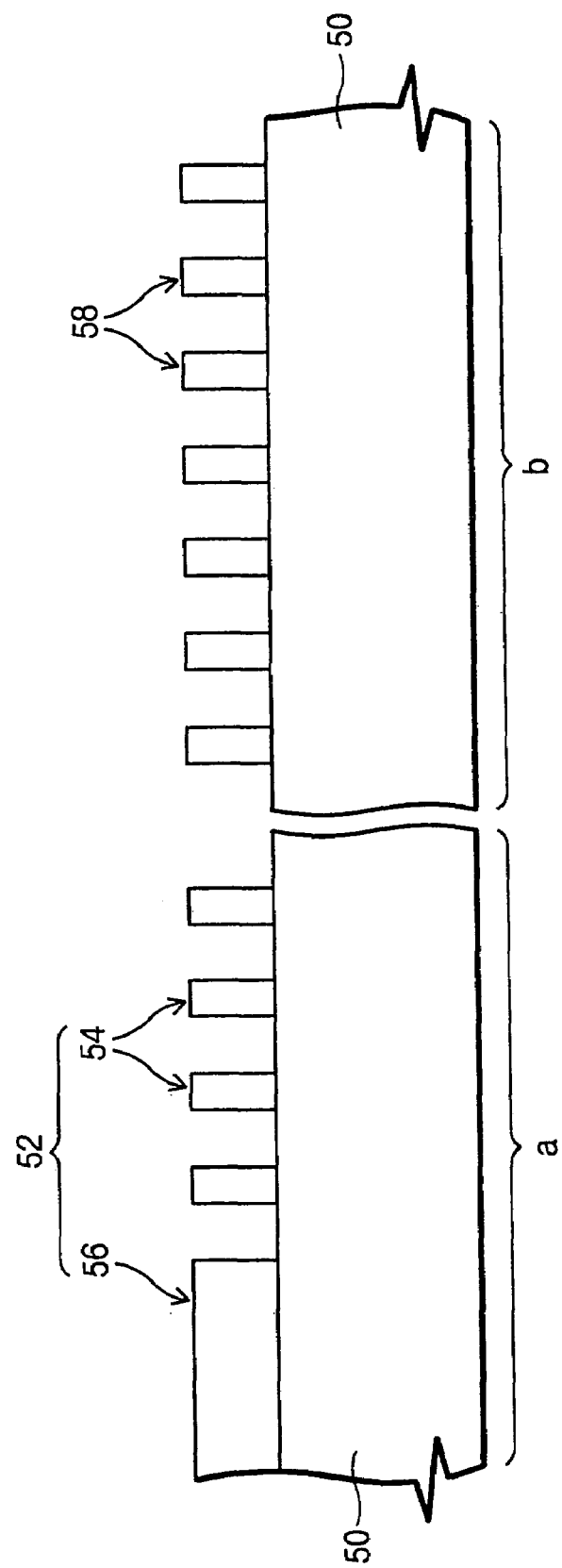
FIGS. 8 through 10 are cross-sectional views illustrating a method of controlling a CMP process according to a preferred embodiment of the present invention.
Figure 9:
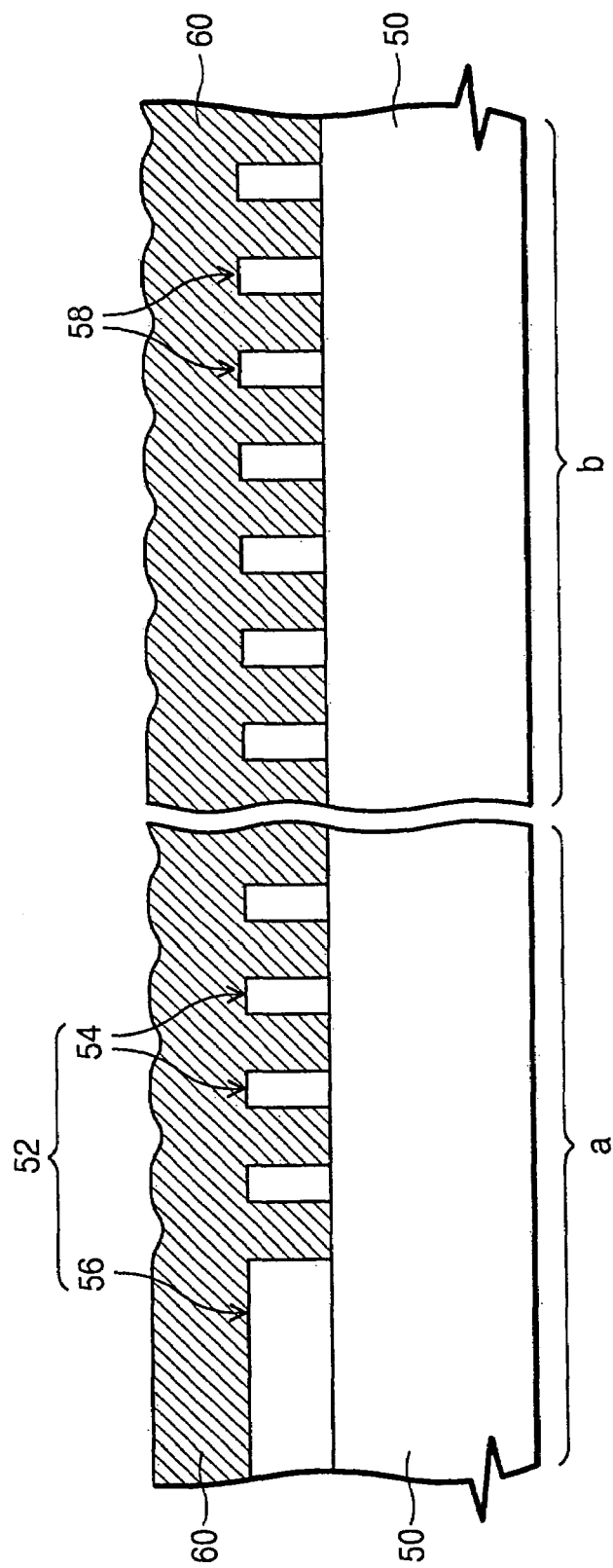
Figure 10:
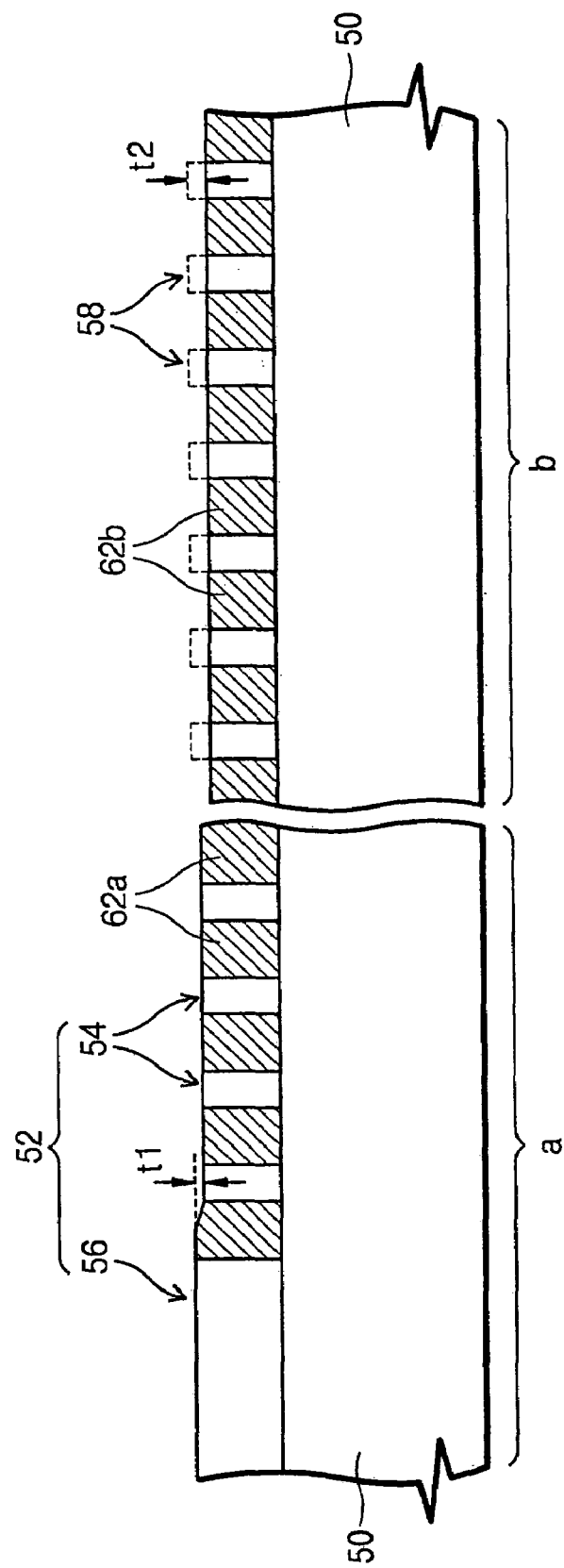

FIGS. 8 to 10 are cross-sectional views illustrating a method of controlling a CMP process according to the preferred embodiment of the present invention. Portions denoted by reference numerals "a" and "b" illustrate the monitoring region and the main region, respectively.

Referring to FIG. 8, a test pattern 52 is formed on the monitoring region a of the semiconductor substrate 50, and a main pattern 58 is formed on the main region b. The main pattern 58 and the test pattern 52 may be formed by forming a first material layer on the semiconductor substrate 50 and patterning the first material layer. The test pattern 52 includes two regions each having a different pattern density, for example, a planar region 56 and a pattern region 54. The pattern region 54 is formed to have the same pattern density as the main region 58.

Preferably, patterns having the same structure as the main pattern 58 may be formed on the pattern region 54.

Referring to FIGS. 9 and 10, a gap fill material layer 60, or polishing target layer, is formed on an entire surface of the resultant structure where the main pattern 58 and the test pattern 52 are formed. Preferably, the test pattern and the main pattern are silicon oxide layers, and the polishing target layer is a metal layer.

Unlike conventional methods, in the present invention, a step of measuring an initial thickness of the test pattern 52 is omitted. The CMP is applied to the semiconductor substrate 50 where the gap fill material layer 60 is formed. As a result, the gap fill material layer 60 is polished until the test pattern 52 and the main pattern 58 are exposed, thereby forming a gap fill pattern 62a, 62b. As illustrated in FIGS. 9 and 10, because the test pattern 52 is divided into two regions having different pattern densities, a polishing rate of the pattern region 54 is different from that of the planar region 56 due to a removal selectivity. Also, because the CMP employs slurry having a high polishing rate with respect to the gap fill material layer 60, the pattern region 54 is polished comparatively faster than the planar region 56. As a result, the test pattern 52 has a step difference t1. The CMP process is generally carried out until the main pattern 58 is over-etched, to prevent the gap fill material layer 60 from remaining on the main pattern 58. When the gap fill material layer 60 is polished to expose the test pattern 52 and the main pattern 58, the main pattern 58 is over-etched and simultaneously the test pattern 52 has the step difference t1 due to the removal selectivity. As the CMP proceeds, the step difference t1 of the test pattern 52 increases in proportion to an over-etched thickness t2 of the main pattern 58. This results in a correlation between the step difference t1 of the test pattern 52 and the over-etched thickness t2 of the main pattern 58. In other words, the over-etched thickness t2 of the main pattern 58 can be measured by measuring the step difference t1 of the test pattern. The correlation between the step difference of the test pattern and the etched thickness of the main pattern is quantitative data obtained by applying the CMP to a plurality of test lots. According to an embodiment of the present invention, applying the CMP is followed by measuring the step difference of the test pattern 52. Accordingly, before undergoing the CMP, a step of measuring a thickness of the test pattern 52 may be omitted. Also, unlike the conventional method, in the case where the gap fill material layer 60 is made of metals, the present invention can control processes without being affected by changes in a thickness caused by a cleaning process.

Figure 11:
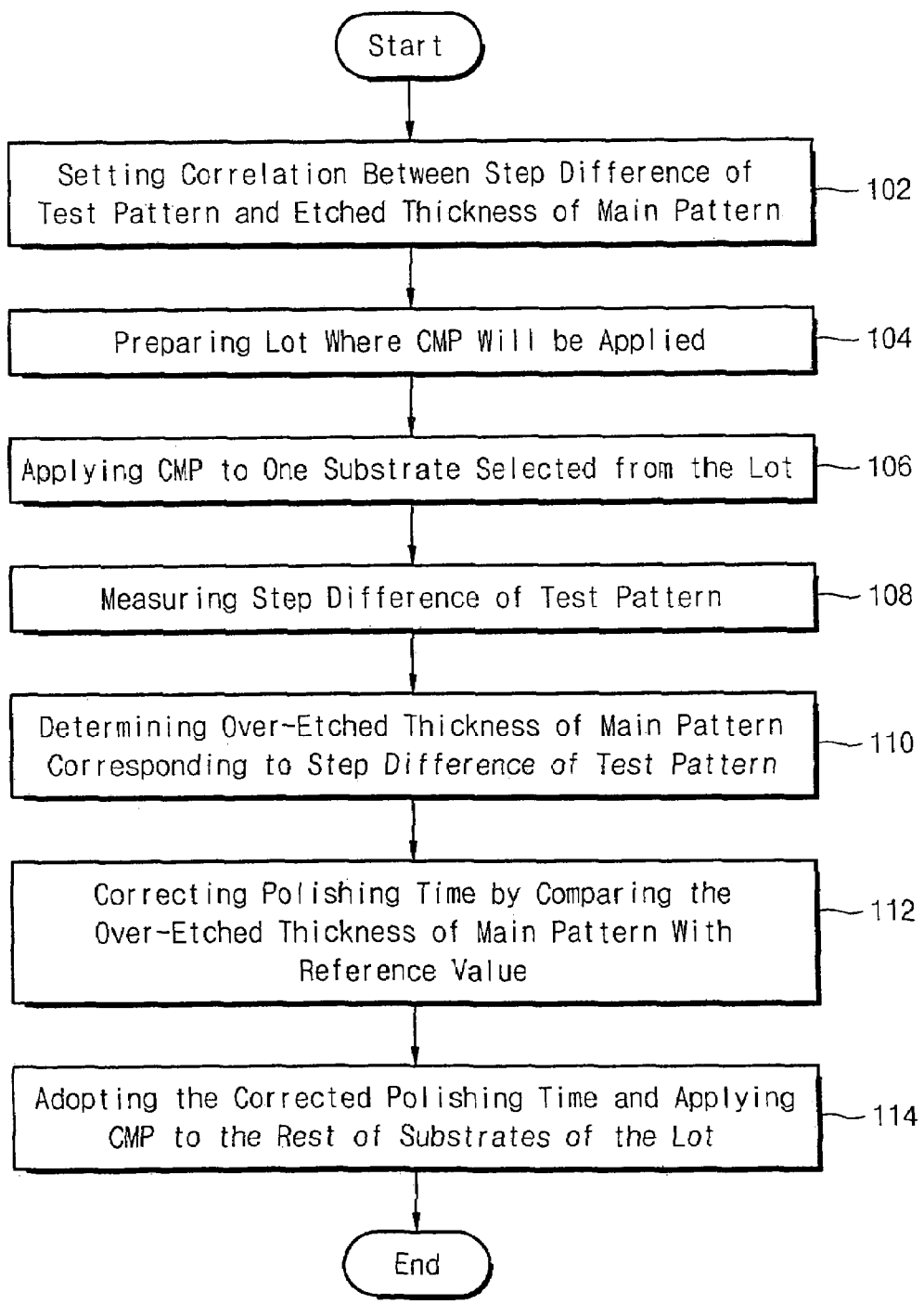
FIGS. 11 and 12 are process flowcharts illustrating a method of controlling the CMP process using a correlation between a step difference of the test pattern and an etched thickness of the main pattern.
Figure 12:
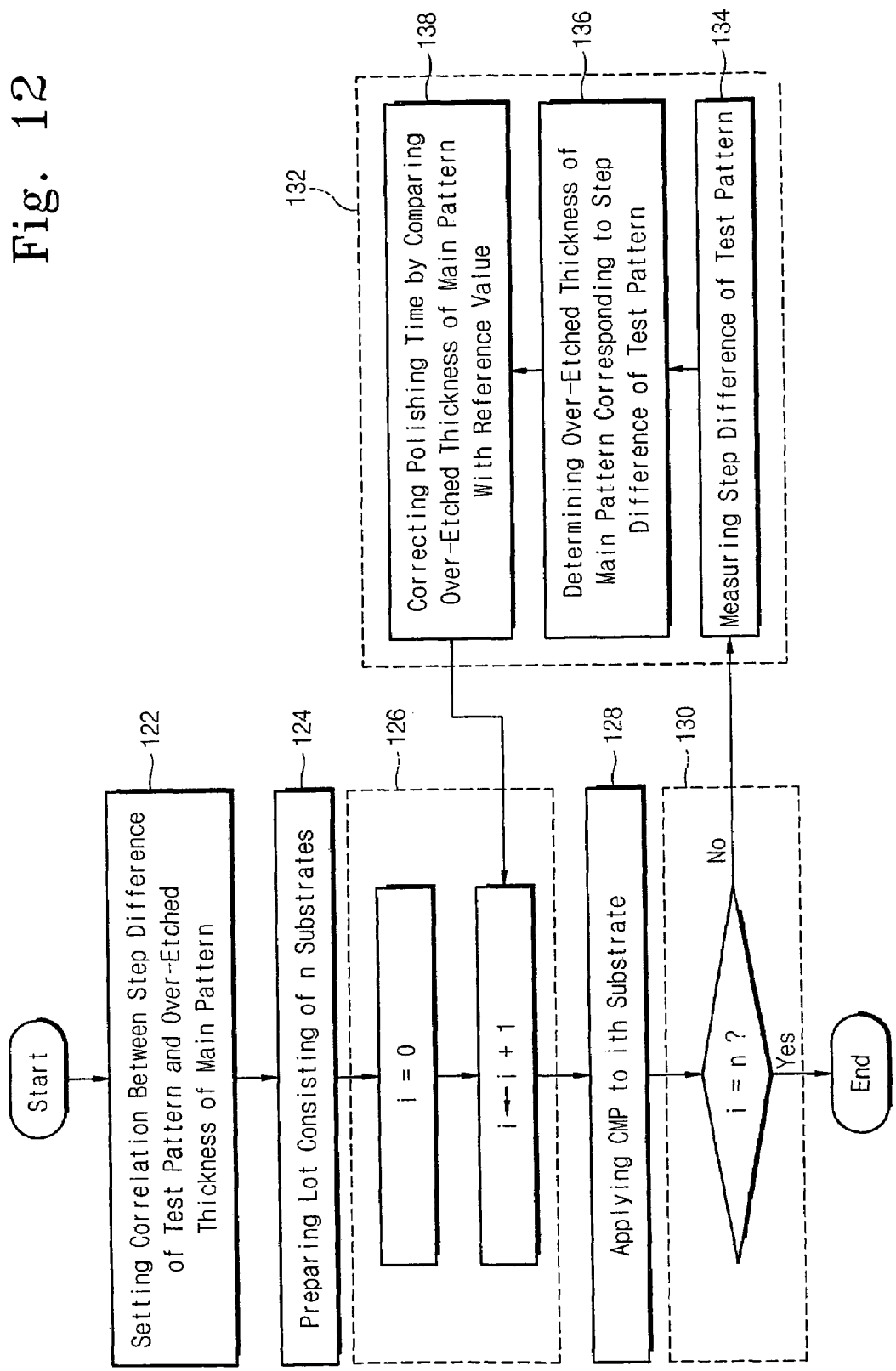

FIGS. 11 and 12 are process flowcharts illustrating the method of controlling the CMP using the correlation between the step difference of the test pattern and the etched thickness of the main pattern.

FIG. 11 is a flowchart illustrating a method of correcting a polishing time of each lot.

Referring to step 102 of FIG. 11, before applying CMP to a main lot, a step difference of a test pattern and an etched thickness of a main pattern are measured at a test lot of which conditions are the same as those of the main lot. Correlation between the step difference of the test pattern and the etched thickness of the main pattern may be obtained by performing the CMP at each substrate of the test lot, then measuring a step difference of a test pattern and an etched thickness of a main pattern at each substrate. As mentioned above with reference to FIG. 10, the step difference of the test pattern and the over-etching of the main pattern are not generated until the test pattern and the main pattern start to be exposed. Thus, the etched thickness of the main pattern is proportional to the step difference of the test pattern. At this time, a reference value is set for an optimum over-etched thickness of the main pattern. In addition, because there is a functional relationship between the step difference of the test pattern and the polishing time, an increase rate of a step difference of the test pattern can be calculated by using data on the step difference of the test pattern. The increase rate of the step difference may be applied while correcting the polishing time at the main lot.

Referring to steps 104 and 106 of FIG. 11, a lot where the CMP will be applied is prepared. The lot is a unit of the fabrication process and normally consists of 40 or 50 substrates. The CMP is applied to one substrate selected from the lot. While polishing multiple substrates, process factors of the CMP may be changed. Thus, in the case where initial process conditions are applied, there may arise process dispersion. Therefore, after selecting one substrate from each lot and performing the CMP at the selected substrate, the polishing time may be corrected and then applied to the rest of the substrates.

Referring to steps 108 through 112 of FIG. 11, a step difference of the test pattern is measured at the substrate where the CMP is applied (step 108). The step difference of the test pattern can be calculated by measuring a step difference between the pattern region and the planar region using a profiler. Alternatively, each thickness of the pattern region and the planar region may be measured to calculate the step difference of the test pattern. An etched thickness of the main pattern, which corresponds to the measured step difference of the test pattern, is calculated (step 110). The etched thickness of the main pattern can be obtained by applying the step difference of the test pattern to the pre-set correlation at the test lot. Thereafter, the etched thickness of the main pattern is compared with the reference value, thereby correcting a polishing time of the CMP (step 112). The polishing time can be corrected by calculating a difference between the step difference of the test pattern corresponding to the reference value and the measured step difference of the test pattern, then applying the increase rate of the step difference calculated at the test lot.

Referring to step 114 of FIG. 11, the corrected polishing time is adopted and applied to the rest of substrates of the lot to be polished by the CMP. If the etched thickness of the main pattern is more than the reference value, the polishing time is reduced. By comparison, if the etched thickness of the main pattern is less than the reference value, the polishing time may be extended and applied to the rest of substrates.

As described above, in the case of a method of correcting a polishing time of each lot, process dispersion may be generated in each substrate of the lot. Nevertheless, because the polishing time is corrected by using one substrate selected from each lot, process time can be reduced. That is, the method of correcting the polishing time of each lot is suitable for an initial state in which process factors of a CMP apparatus are stable.

FIG. 12 is the flowchart illustrating a method of correcting the polishing time of each substrate.

Referring to FIG. 12, similar to the method of correcting the polishing time of each lot, a correlation between the step difference of the test pattern and an etched amount of the main pattern is set (step 122), and a main lot is then prepared (step 124). The main lot comprises n substrates. As described above, the lot can include 40 or 50 substrates. One substrate is selected from the lot, e.g., ith substrate (step 126), and the CMP is applied to the selected substrate (step 128). Step 132 of FIG. 12 represents correcting the polishing time by using the substrate where the CMP is applied. The step difference of the test pattern is measured at the substrate where the CMP is performed (step 134), and the measured step difference is applied to the pre-set correlation, thereby calculating an etched thickness of the main pattern (step 136). The etched thickness of the main pattern is compared with the reference value to correct the polishing time (step 138). The CMP is performed by applying the corrected polishing time to a subsequent substrate, e.g., i+1 substrate. The polishing time is corrected through Step 132, and the corrected polishing time is applied to a subsequent substrate. The foregoing steps are repeatedly applied to n substrates (step 130). As described above, a method of correcting a polishing time of each substrate has an advantage of reducing process dispersion of each substrate, as compared with a method of correcting a polishing time of each lot. Because a step difference of a test pattern is measured at all substrates except the last substrate, a process time may be extended as compared with the method of correcting the polishing time of each lot. However, the process time can be remarkably reduced as compared with conventional methods in which a thickness is measured before and after the CMP. The method of correcting the polishing time of each substrate is preferably applied when process factors are not stable.

According to embodiments of the present invention as described above, an etched thickness of a main pattern is measured during a CMP process. As a result, a process time can be reduced as compared with conventional methods, and a reliable method of controlling processes can be provided even during a metal polishing process in which a thickness cannot be measured just before the CMP.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method of controlling a chemical mechanical polishing (CMP), which is applied to a semiconductor substrate having a test pattern and a main pattern, the method comprising:

setting a correlation between a step difference of the test pattern and an etched thickness of the main pattern;

applying the CMP to the semiconductor substrate for a predetermined time;

measuring the step difference of the test pattern;

determining the etched thickness of the main pattern corresponding to the step difference of the test pattern from the correlation; and correcting a polishing time by comparing the determined etched thickness of the main pattern with a reference value, wherein the corrected polishing time is applied to a subsequent lot.

2. The method as claimed in claim 1, wherein the applying the CMP to the semiconductor substrate step comprises:

forming a polishing target layer on an entire surface of the semiconductor substrate having the test pattern and the main pattern; and polishing the polishing target layer to expose the test pattern and the main pattern, wherein the polishing target layer is polished such that upper portions of the test pattern and the main pattern are partially over-etched.

3. The method as claimed in claim 2, wherein the polishing target layer is composed of a material having an etch selectivity with respect to the test pattern and the main pattern.

4. The method as claimed in claim 3, wherein the test pattern and the main pattern are silicon oxide layers, and the polishing target layer is a metal layer.

5. The method as claimed in claim 1, wherein the test pattern includes a pattern region and a planar region, wherein the pattern region has the same pattern density as a main region of the substrate.

6. The method as claimed in claim 5, wherein the step difference of the test pattern is obtained by measuring a difference in thickness between the pattern region and the planar region where the CMP is applied.

7. The method as claimed in claim 5, wherein the step difference of the test pattern is measured using a profiler.

8. The method as claimed in claim 1, wherein the correlation between the step difference of the test pattern and the etched thickness of the main pattern is quantitative data obtained by applying the CMP to a plurality of test lots.

9. The method as claimed in claim 1, wherein the correcting the polishing time step comprises:

reducing the polishing time when the step difference of the test pattern is more than the reference value; and extending the polishing time when the step difference of the test pattern is less than the reference value.

10. The method as claimed in claim 1, wherein the measuring the step difference step, the determining the etched thickness step, and the correcting the polishing time step are performed at each substrate where the CMP is applied, and then applied to a subsequent substrate.

11. The method as claimed in claim 1, wherein the measuring the step difference step, the determining the etched thickness step, and the correcting the polishing time step are performed periodically at a plurality of substrates.

* * * * *